(12) United States Patent
Zhang

(10) Patent No.: US 11,194,199 B2
(45) Date of Patent: Dec. 7, 2021

(54) METHOD OF MANUFACTURING ARRAY SUBSTRATE, ARRAY SUBSTRATE, AND LCD PANEL

(71) Applicant: TCL CHINA STAR OPTOELECTRONICS TECHNOLOGY CO., LTD., Shenzhen (CN)

(72) Inventor: Xia Zhang, Guangdong (CN)

(73) Assignee: TCL CHINA STAR OPTOELECTRONICS TECHNOLOGY CO., LTD, Shenzhen (CN)

(*) Notice: Subject to any disclaimer, the term of this patent is extended or adjusted under 35 U.S.C. 154(b) by 57 days.

(21) Appl. No.: 16/645,238

(22) PCT Filed: Jan. 14, 2020

(86) PCT No.: PCT/CN2020/071914
§ 371 (c)(1),
(2) Date: Mar. 6, 2020

(87) PCT Pub. No.: WO2021/134833
PCT Pub. Date: Aug. 7, 2021

(65) Prior Publication Data
US 2021/0208459 A1   Jul. 8, 2021

(30) Foreign Application Priority Data
Jan. 3, 2020 (CN) .......................... 202010003667.2

(51) Int. Cl.
*G02F 1/1362* (2006.01)
*H01L 23/544* (2006.01)
*G02F 1/1368* (2006.01)

(52) U.S. Cl.
CPC ...... *G02F 1/136209* (2013.01); *G02F 1/1368* (2013.01); *G02F 1/136222* (2021.01); *H01L 23/544* (2013.01); *H01L 2223/54426* (2013.01)

(58) Field of Classification Search
None
See application file for complete search history.

(56) References Cited

U.S. PATENT DOCUMENTS

2008/0037104 A1* 2/2008 Hagood ................. G02B 26/00
359/292
2016/0336273 A1* 11/2016 Cao ..................... H01L 27/1218

FOREIGN PATENT DOCUMENTS

| CN | 107966865 A | 4/2018 |
|---|---|---|
| CN | 107991803 A | 5/2018 |
| JP | 2006221015 A | 8/2006 |
| TW | 200706975 A | 2/2007 |

* cited by examiner

*Primary Examiner* — Ashok Patel
(74) *Attorney, Agent, or Firm* — The Roy Gross Law Firm, LLC; Roy Gross

(57) ABSTRACT

The disclosure provides a method of manufacturing an array substrate, an array substrate, and a liquid crystal display (LCD) panel. A non-display area of the array substrate includes a substrate, an alignment mark, an insulating layer, a hydrophobic layer, and a black photo spacer (BSP) pattern. The hydrophobic layer is disposed on the insulating layer corresponding to the alignment mark. When a BSP material is coated, a thickness of a BSP layer on the hydrophobic layer is reduced, thereby effectively fixing a problem that it is difficult to recognize an alignment mark.

20 Claims, 5 Drawing Sheets

METHOD OF MANUFACTURING ARRAY SUBSTRATE, ARRAY SUBSTRATE, AND LCD PANEL

FIELD

The present disclosure relates to the field of display technologies, and more particularly, relates to a method of manufacturing an array substrate, an array substrate, and a liquid crystal display (LCD) panel.

BACKGROUND

In conventional thin film transistor liquid crystal displays (TFT-LCDs), a black matrix and a photo spacer have already been replaced by a black photo spacer (BPS) material, which has functions thereof, to reduce production time, and a BPS is disposed on a side of an array substrate. Different from a manufacturing process sequence of conventional LCD panels, the BPS is not formed during a first process. Therefore, the BPS needs to be accurately aligned according to an alignment mark to prevent the LCD panels from displaying abnormalities due to a misalignment of the BPS. However, the BPS material has a relatively high optical density, making it difficult to align with an alignment mark during an exposure process of a wet film coating process. On the other hand, if a material with a relatively low optical density is applied, a light shading effect will be affected, leading to light leakage or color shifting. Therefore, in developing BSP technologies, how to precisely recognize an alignment mark without affecting the light shading effect is a technical problem that needs to be solved.

As a result, it is necessary to solve a problem that it is difficult to recognize an alignment mark in conventional array substrates.

SUMMARY

The present disclosure provides a method of manufacturing an array substrate, an array substrate, and a liquid crystal display (LCD) panel to alleviate a technical problem that an alignment mark in conventional array substrates is difficult to be recognized.

To solve the above problem, technical solutions provided by the present disclosure are described as follows.

An embodiment of the present disclosure provides a method of manufacturing an array substrate, including following steps: Step 10: providing a substrate, and forming an alignment mark on the substrate. Step 20: forming an insulating layer on the substrate where the alignment mark is formed, coating a hydrophobic layer on the insulating layer corresponding to the alignment mark, and drying the hydrophobic layer. Step 30: coating a BSP material on the insulating layer and the hydrophobic layer, and exposing, developing, and etching the BSP material to form a BSP pattern.

In the method provided by the embodiment of the present disclosure, the Step 10 further includes: forming an active layer on the substrate. The active layer includes a first metal layer and a second metal layer, the alignment mark is formed from at least one of the first metal layer or the second metal layer, and the alignment mark is located in a non-display area of the substrate.

In the method provided by the embodiment of the present disclosure, the alignment mark is formed from the first metal layer.

In the method provided by the embodiment of the present disclosure, the alignment mark is formed from the second metal layer.

In the method provided by the embodiment of the present disclosure, in the Step 20, a material of the hydrophobic layer includes polyethylene terephthalate.

In the method provided by the embodiment of the present disclosure, a process of coating the hydrophobic layer includes an inkjet printing process, a spray coating process, a slit coating process, or a spin coating process.

In the method provided by the embodiment of the present disclosure, the hydrophobic layer is dried at a temperature ranging from 80° C. to 150° C.

In the method provided by the embodiment of the present disclosure, the Step 20 further includes: forming a color filter layer before the insulating layer is formed, and forming a pixel electrode layer on the insulating layer after the insulating layer is formed, wherein the color filter layer and the pixel electrode layer are located in a display area of the substrate.

In the method provided by the embodiment of the present disclosure, a material of the pixel electrode layer includes indium tin oxide.

In the method provided by the embodiment of the present disclosure, a material of the insulating layer includes a composite including one or more of SiOx, SiNx, and SiON.

In the method provided by the embodiment of the present disclosure, in the Step 30, a film thickness of a black photo spacer (BSP) on the hydrophobic layer is less than a film thickness of a BSP on the insulating layer after the BSP material is coated, so that an alignment process is accurately performed by recognizing the alignment mark during an exposure process.

In the method provided by the embodiment of the present disclosure, the BSP on the hydrophobic layer and the BSP on the insulating layer are connected.

In the method provided by the embodiment of the present disclosure, the BSP on the hydrophobic layer and the BSP on the insulating layer are disconnected.

In the method provided by the embodiment of the present disclosure, in the Step 30, a BSP is not located on the hydrophobic layer after the BSP material is coated, so that an alignment process is accurately performed by recognizing the alignment mark during an exposure process.

An embodiment of the present disclosure provides an array substrate, including a display area and a non-display area. The non-display area includes an alignment mark, an insulating layer, a hydrophobic layer, and a BSP pattern, which are stacked on a substrate. The alignment mark is disposed on the substrate. The insulating layer is disposed on the alignment mark. The hydrophobic layer is disposed on the alignment mark and the insulating layer. The BSP pattern is disposed on the insulating layer. The BSP includes a black matrix and a support post.

In the array substrate provided by the embodiment of the present disclosure, the display area includes an active layer, a color filter layer, an insulating layer, and a pixel electrode layer. The active layer is disposed on the substrate, wherein the active layer includes a first metal layer and a second metal layer. The color filter layer is disposed on the active layer, the insulating layer is disposed on the color filter layer, and the insulating layer extends from the display area to the non-display area. The pixel electrode layer is disposed on the insulating layer, and the alignment mark is formed from at least one of the first metal layer or the second metal layer.

In the array substrate provided by the embodiment of the present disclosure, a material of the hydrophobic layer includes polyethylene terephthalate.

An embodiment of the present disclosure further provides a liquid crystal display (LCD) panel, including a first substrate, a second substrate disposed opposite to the first substrate, and a plurality of liquid crystal molecules disposed between the first substrate and the second substrate. The second substrate includes a display area and a non-display area. The non-display area includes an alignment mark, an insulating layer, a hydrophobic layer, and a BSP pattern, which are stacked on a substrate. The alignment mark is disposed on the substrate. The insulating layer is disposed on the alignment mark. The hydrophobic layer is disposed on the alignment mark and the insulating layer. The BSP pattern is disposed on the insulating layer. The BSP includes a black matrix and a support post.

In the display panel provided by the embodiment of the present disclosure, the display area includes an active layer, a color filter layer, an insulating layer, and a pixel electrode layer. The active layer is disposed on the substrate, wherein the active layer includes a first metal layer and a second metal layer. The color filter layer is disposed on the active layer, the insulating layer is disposed on the color filter layer, and the insulating layer extends from the display area to the non-display area. The pixel electrode layer is disposed on the insulating layer, and the alignment mark is formed from at least one of the first metal layer or the second metal layer.

In the display panel provided by the embodiment of the present disclosure, a material of the hydrophobic layer includes polyethylene terephthalate.

Regarding the beneficial effects: in a method of manufacturing an array substrate, an array substrate, and an LCD panel provided by the present disclosure, a hydrophobic layer is disposed on an insulating layer corresponding to an alignment mark, thereby making a difference of hydrophilicity between an alignment mark area and a non-alignment mark area. When a BSP wet film is coated in a sequent process, because of the hydrophobic layer, film thicknesses of the BSP wet film in different positions are affected. A film thickness of the alignment mark area where the BSP covers is reduced, and a light shading effect of the alignment mark area is reduced, thereby solving a problem that it is difficult to recognize an alignment mark and improving accuracy of an alignment process. At the same time, problems of long alignment time and long tack time due to the difficulty in recognizing an alignment mark are solved, thereby reducing production costs.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION

Figure 1:
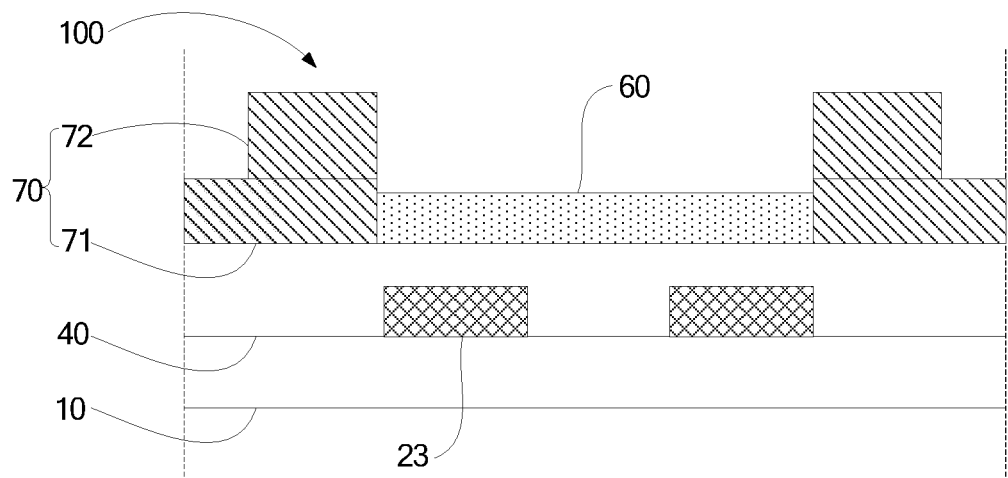
FIG. 1 is a schematic front view showing a structure of layers in a non-display area of an array substrate provided by an embodiment of the present disclosure.

The following description of the various embodiments is provided with reference to the accompanying drawings to demonstrate that the embodiments of the present disclosure may be implemented. It should be understood that terms such as "upper," "lower," "front," "rear," "left," "right," "inside," "outside," "lateral" as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In the drawings, the identical or similar reference numerals constantly denote the identical or similar elements or elements having the identical or similar functions.

Figure 2:
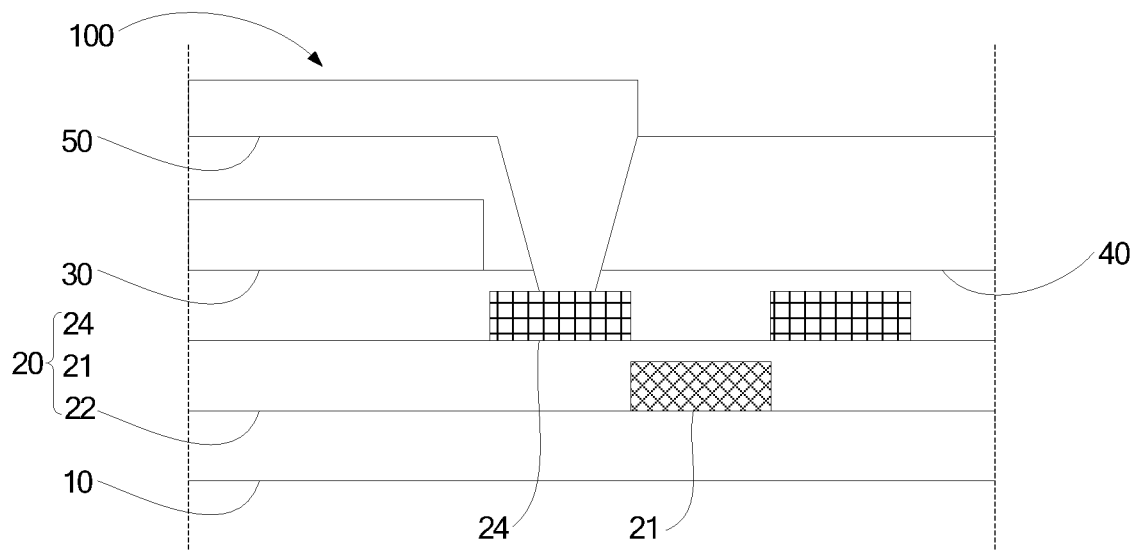
FIG. 2 is a schematic front view showing a structure of layers in a display area of an array substrate provided by an embodiment of the present disclosure.

In one embodiment, as shown in FIG. 1 and FIG. 2, an array substrate 100 is provided, including a display area and a non-display area (FIG. 1 shows the non-display area of the array substrate 100, and FIG. 2 shows the display area of the array substrate 100). The non-display area includes an alignment mark 23, an insulating layer 40, a hydrophobic layer 60, and a black photo spacer (BSP) pattern 70 stacked on a substrate 10. The alignment mark 23 is disposed on the substrate 10. The insulating layer 40 is disposed on the alignment mark 23. The hydrophobic layer 60 is disposed on the insulating layer 40 corresponding to the alignment mark 23. The BSP pattern 70 is disposed on the insulating layer 60, wherein the BSP pattern 70 includes a black matrix 71 and a support post 72.

Specifically, the display area of the array substrate 100 includes an active layer 20, a color filter layer 30, an insulating layer 40, and a pixel electrode layer 50, which are as shown in FIG. 2.

Specifically, the active layer 20 includes a first metal layer 21, an interlayer insulating layer 22, and a second metal layer 24. The alignment mark 23 is formed from the first metal layer 21 or the second metal layer 24 and is formed on the non-display area of the array substrate 100. As shown in FIG. 1 and FIG. 2, the alignment mark 23 is formed from the first metal layer 21 and is formed on the non-display area of the array substrate 100.

It should be noted that the array substrate 100 of the present disclosure further includes other common layers, such as a buffer layer and an active layer, which are not described in the embodiments and in figures of the present disclosure.

Furthermore, materials of the first metal layer 21 and the second metal layer 24 may be one selected from the group consisting of Cu, Al, Ti, Mo, or combinations thereof. In addition to the first metal layer 21 or the second metal layer 24, the alignment mark 23 may also be a layer made of a single metal material such as Cu, Al, Ti, or Mo.

Specifically, the color filter layer 30 is formed on the active layer 20. The color filter layer 30 includes three types of color resist pattern (red, green, and blue), which are not shown in FIG. 2. By forming the color filter layer 30 on the array substrate 100 (a color filter on array technology), difficulty in aligning a top substrate with a bottom substrate is reduced.

Furthermore, the insulating layer 40 is formed on the color filter layer 30 and extends from the display area of the array substrate 100 to the non-display area of the array substrate 100.

Furthermore, the pixel electrode layer 50 is formed on the insulating layer 40 and does not extend to the non-display area of the array substrate 100. A material of the pixel electrode 50 is a transparent electrode material such as indium tin oxide.

Furthermore, as shown in FIG. 1, the hydrophobic layer 60 is formed on the insulating layer 40. Specifically, the hydrophobic layer 60 is disposed on the insulating layer 40 corresponding to the alignment mark 23, thereby making a hydrophilicity difference between an alignment mark area and a non-alignment mark area.

Furthermore, a material of the hydrophobic layer 60 includes a hydrophobic material such as polyethylene terephthalate.

Furthermore, the BSP pattern 70 is formed on the non-display area of the array substrate 100, and the BSP pattern 70 includes a black matrix 71 and a support post 72. The black matrix 71 is used to block light, and the support post 72 is used to support the top substrate and the bottom substrate to control a thickness of a cell. A shape of the support post 72 is cuboid-shaped, and a sectional shape of the support post is rectangular, which is shown in FIG. 1.

Specifically, a BSP material is coated on the insulating layer 40 and the hydrophobic layer 60. Because of the hydrophobic layer 60, film thicknesses of a BSP wet film in different positions are affected. A film thickness of the alignment mark area where the BSP covers is reduced, and a light shading effect of the alignment mark area is reduced, thereby solving a problem that it is difficult to recognize an alignment mark and improving accuracy of an alignment process.

Specifically, a material of the BSP is a photoresist.

Figure 3:
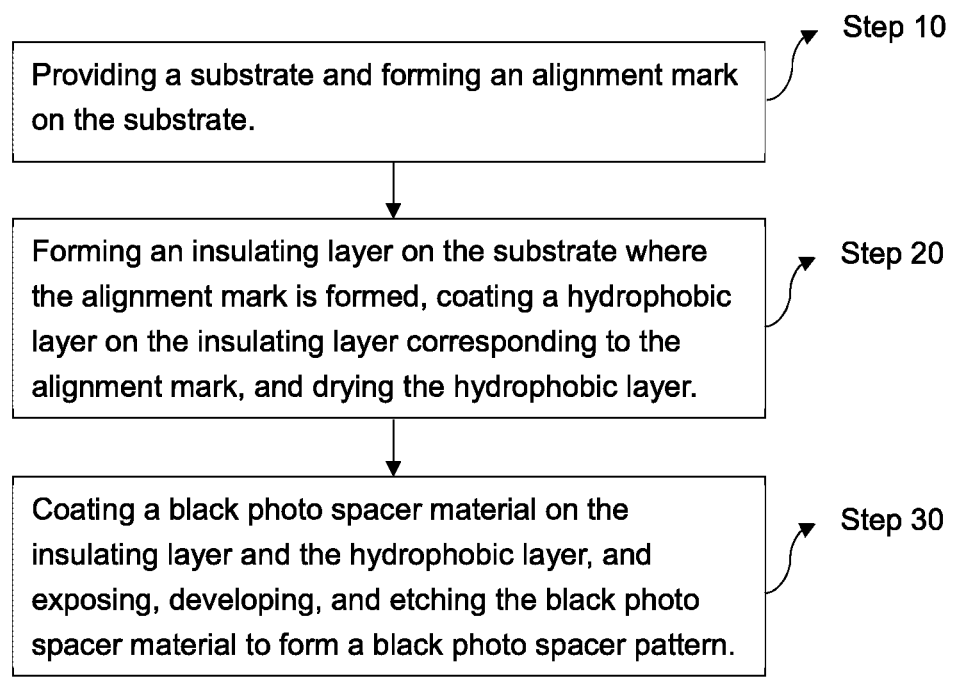
FIG. 3 is a schematic flowchart showing a method of manufacturing an array substrate provided by an embodiment of the present disclosure.
Figure 4:
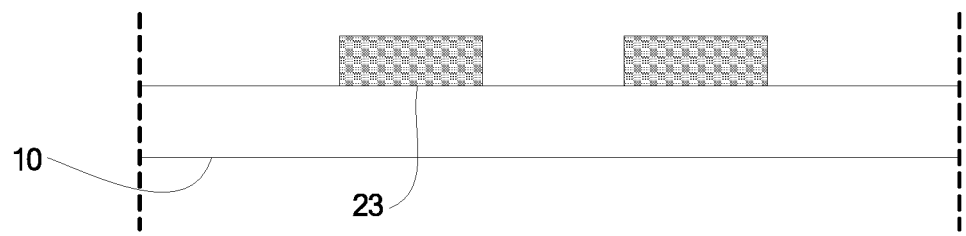
FIG. 4 to FIG. 10 are schematic views showing layers of the array substrate in each step of the manufacturing method for the array substrate provided by an embodiment of the present disclosure.

In one embodiment, a method of manufacturing an array substrate is provided as shown in FIG. 3, including following steps:

Step 10: providing a substrate 10, and forming an alignment mark 23 on the substrate 10, as shown in FIG. 4.

Figure 5:
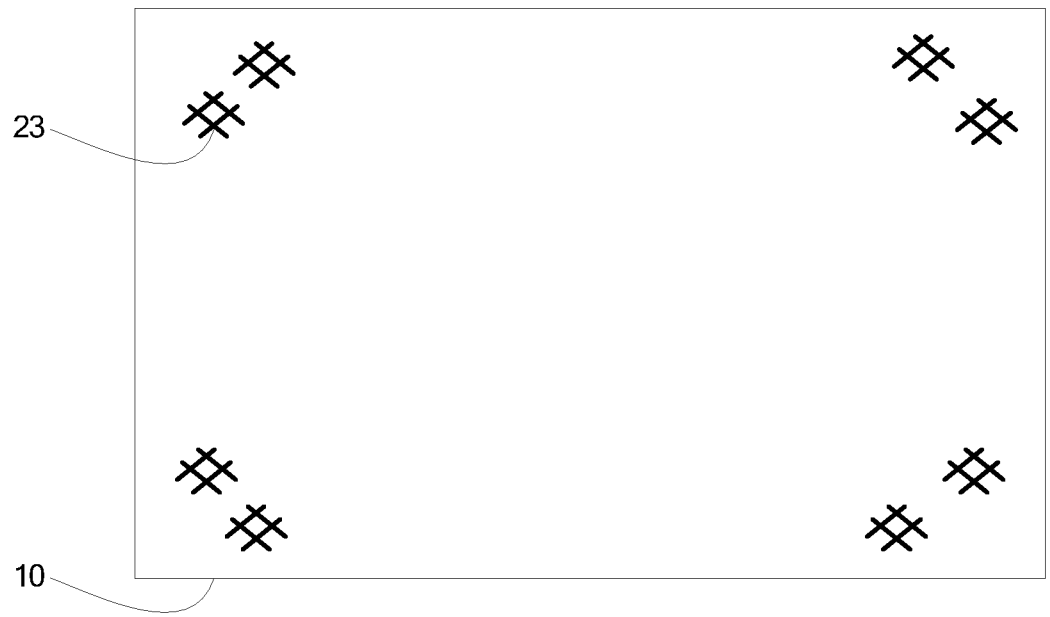

Specifically, an active layer 20 is formed on the substrate 10, wherein the active layer 20 includes the first metal layer 21 and the second metal layer 24, as shown in FIG. 2. The alignment mark 23 is formed from at least one of the first metal layer 21 or the second metal layer 24. The alignment mark 23 as shown in FIG. 1 is formed from the first metal layer 21. Furthermore, the alignment mark 23 is located in a non-display area of the substrate 10. FIG. 5 is a schematic bottom view showing the alignment mark 23 on the substrate 10, and FIG. 4 is a schematic front view showing the alignment mark 23 on the substrate 10.

Furthermore, before the active layer is formed, a buffer layer needs to be formed on the substrate. The active layer further includes other common layers such as an active layer and other insulating layers, and the active layer is thin film transistors on the array substrate.

Figure 6:
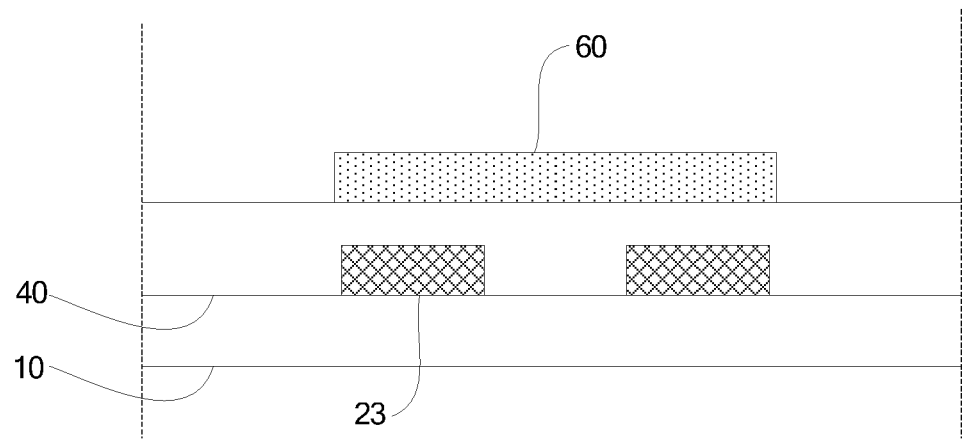

Step 20: forming an insulating layer 40 on the substrate 10 where the alignment mark 23 is formed, coating a hydrophobic layer 60 on the insulating layer 40 corresponding to the alignment mark 23, and drying the hydrophobic layer 60, as shown in FIG. 6.

Specifically, sequentially forming a color filter layer 30, an insulating layer 40, and a pixel electrode layer 50 on the substrate 10 with the alignment mark 23. The color filter layer 40 and the pixel electrode layer 50 are disposed in the display area of the substrate 10, as shown in FIG. 2.

Specifically, the color filter layer 40 includes three types of color resist pattern (red, green, and blue). By forming the color filter layer 40 on an array substrate (a color filter on array technology), difficulty in aligning a top substrate with a bottom substrate is reduced.

Specifically, coating a red color resist on the substrate with the alignment mark, and then exposing, developing, and etching the red color resist to form the red color resist pattern, wherein the green color resist pattern and the blue color resist pattern can be manufactured by the same method.

Specifically, the insulating layer extends from the display area of the substrate to the non-display area. A material of the insulating layer includes a composite including one or more of non-organic materials such as SiOX, SiNx, and SiNO.

Furthermore, a non-organic material, such as silicon oxide, is deposited on the color filter layer by a chemical vapor deposition process to form the insulating layer.

Specifically, a material of the pixel electrode is a transparent electrode material such as indium tin oxide.

Specifically, after layers in the display area of the substrate are formed, the hydrophobic layer is formed in the non-display area of the substrate. Specifically, the hydrophobic layer is formed on the insulating layer corresponding to the alignment mark.

Specifically, a hydrophobic material, such as the polyethylene terephthalate, is coated on the insulating layer with the alignment mark by an inkjet printing process, a spray coating process, a slit coating process, or a spin coating process. In the inkjet printing process, ink may be shot out at a stationary position, which is the most economical method and has the slightest influence on the display area.

Furthermore, the hydrophobic layer which is coated on the insulating layer is dried. Conditions of a drying process may be decided according to a hydrophobic solvent. In the present embodiment, a drying temperature ranges from 80° C. to 150° C.

Furthermore, the hydrophobic layer is disposed on the insulating layer corresponding to the alignment mark to make a difference of hydrophilicity between an alignment mark area and a non-alignment mark area.

Figure 7:
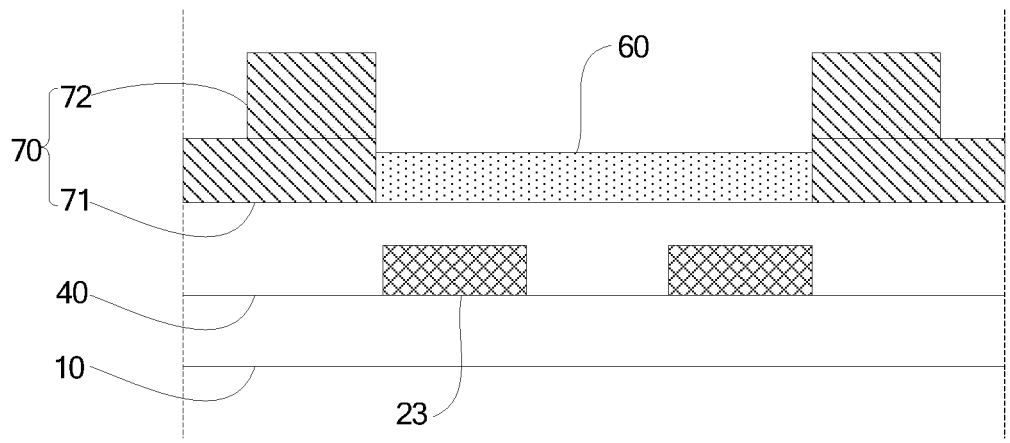

Step 30: coating a BSP material on the insulating layer 40 and the hydrophobic layer 60, and exposing, developing, and etching the BSP material to form a BSP pattern 70, as shown in FIG. 7.

Figure 8:
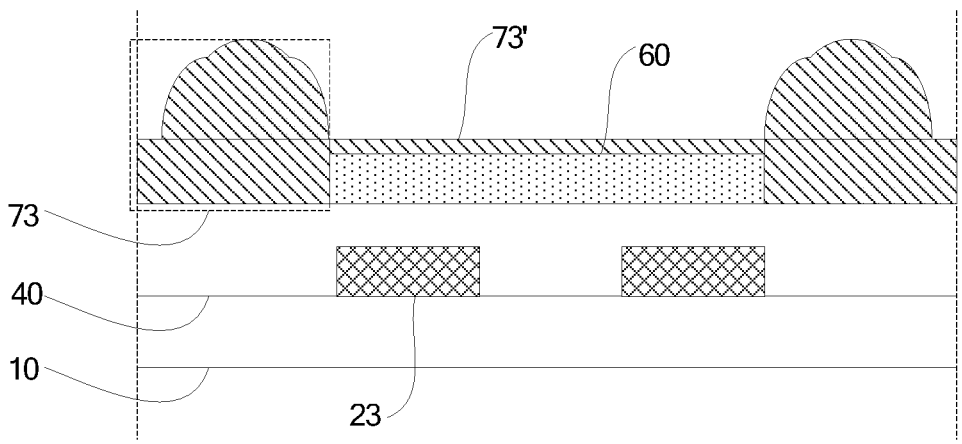
Figure 9:
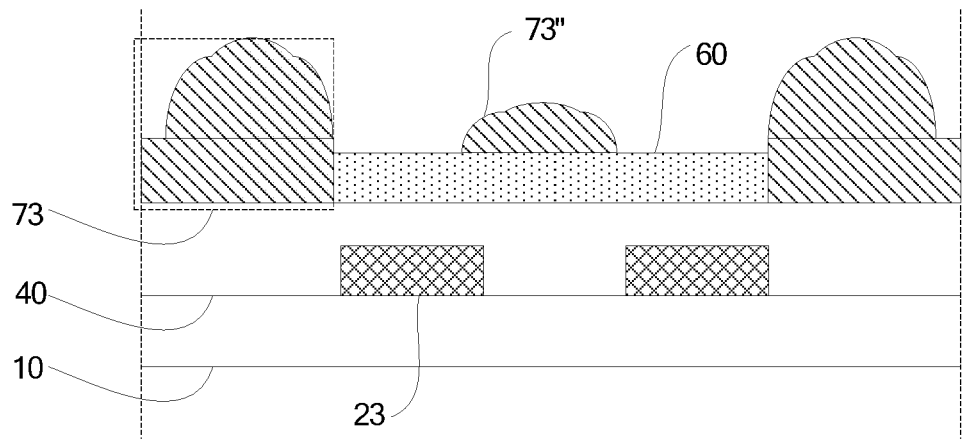
Figure 10:
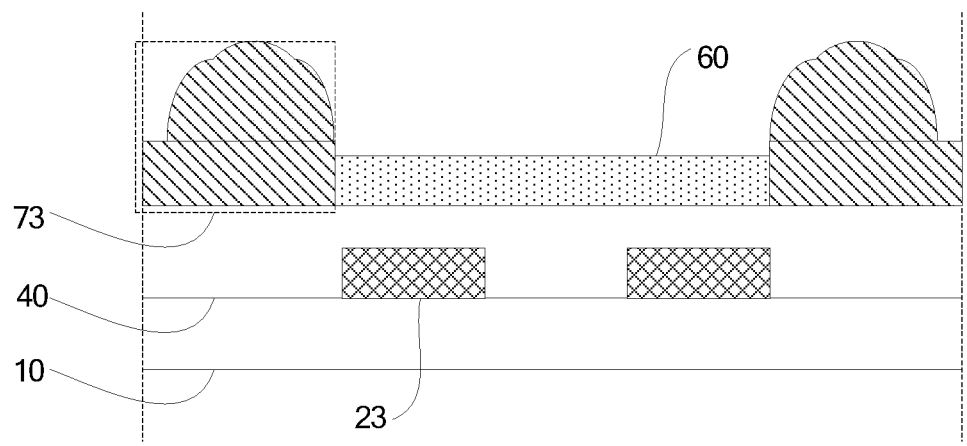

Specifically, the coating process in the Step 30 is same as the coating process in the step of forming the hydrophobic layer. The BSP material is coated on the insulating layer 40 and the hydrophobic layer 60, and then the BSP material is vacuum dried and pre-heated. Because of the hydrophobic layer 60, it is not easy for the BSP material to accumulate in an area where the hydrophobic layer is disposed. Distribution of the BSP material is shown in FIG. 8 to FIG. 10. In FIG. 8, a film thickness of a BSP material 73' on the hydrophobic layer is less than a film thickness of a BSP material 73 not on the hydrophobic layer (on the insulating layer), and the BSP material 73' on the hydrophobic layer and the BSP material 73 not on the hydrophobic layer are connectedly disposed. In FIG. 9, the BSP material 73" on the hydrophobic layer is disconnected, and the BSP material 73"

is disposed only on a portion of the hydrophobic layer. In FIG. 10, none of the BSP material is disposed on the hydrophobic layer.

Furthermore, a BSP layer, which had been preliminarily processed, is exposed, developed, heated, and etched to form a BSP pattern as shown in FIG. 7.

Specifically, in the exposure process, because the film thickness of the BSP material on the hydrophobic layer is less than the film thickness of the BSP material not on the hydrophobic layer or because none of the BSP material is disposed on the hydrophobic layer, light transmittance increases. Therefore, it is easy to recognize the alignment mark, and accuracy of the alignment process increases.

Figure 11:
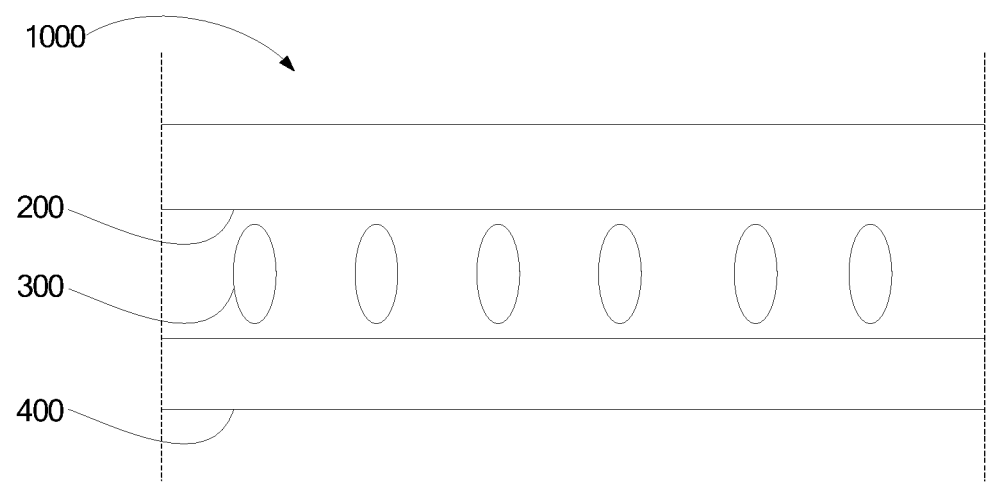
FIG. 11 is a schematic front view showing a structure of a liquid crystal display panel provided by an embodiment of the present disclosure.

In one embodiment, a liquid display panel (LCD) 1000 is provided, as shown in FIG. 11, including a first substrate 200, a second substrate 400, and a plurality of liquid crystal molecules 300. The second substrate 400 is disposed opposite to the first substrate 200 and includes one of the array substrates 100 mentioned in the above embodiments. The liquid crystal molecules 300 are disposed between the first substrate 200 and the second substrate 400.

Specifically, the first substrate 200 is a color filter substrate, and the second substrate 400 is a color filter on array (COA) substrate.

According to the above embodiments, the present disclosure provides a method of manufacturing an array substrate, an array substrate, and an LCD panel. A non-display area of the array substrate includes a substrate, an alignment mark, an insulating layer, a hydrophobic layer, and a BSP pattern. The hydrophobic layer is disposed on the insulating layer corresponding to the alignment mark to make a difference of hydrophilicity between an alignment mark area and a non-alignment mark area. When a BSP wet film is coated in a sequent process, because of the hydrophobic layer, film thicknesses of the BSP wet film in different positions are affected. A film thickness of the alignment mark area where the BSP covers is reduced, and a light shading effect of the alignment mark area is reduced, thereby solving a problem that it is difficult to recognize an alignment mark and improving accuracy of an alignment process. At the same time, problems of long alignment time and long tack time due to the difficulty in recognizing an alignment mark are solved, thereby reducing production costs.

To sum up, the present disclosure has been described with preferred embodiments thereof. The preferred embodiments are not intended to limit the present disclosure, and it is understood that many changes and modifications to the described embodiment can be carried out without departing from the scope and the spirit of the disclosure that is intended to be limited only by the appended claims.

What is claimed is:

1. A method of manufacturing an array substrate, comprising following steps:
    Step 10: providing a substrate, and forming an alignment mark on the substrate;
    Step 20: forming an insulating layer on the substrate where the alignment mark is formed, coating a hydrophobic layer on the insulating layer corresponding to the alignment mark, and drying the hydrophobic layer; and
    Step 30: coating a black photo spacer (BSP) material on the insulating layer and the hydrophobic layer, and exposing, developing, and etching the BSP material to form a BSP pattern.

2. The method of claim 1, wherein the Step 10 further comprises:

forming an active layer on the substrate, wherein the active layer comprises a first metal layer and a second metal layer, the alignment mark is formed from at least one of the first metal layer or the second metal layer, and the alignment mark is located in a non-display area of the substrate.

3. The method of claim 2, wherein the alignment mark is formed from the first metal layer.

4. The method of claim 2, wherein the alignment mark is formed from the second metal layer.

5. The method of claim 1, wherein in the Step 20, a material of the hydrophobic layer comprises polyethylene terephthalate.

6. The method of claim 5, wherein the process of coating the hydrophobic layer comprises an inkjet printing process, a spray coating process, a slit coating process, or a spin coating process.

7. The method of claim 5, wherein the hydrophobic layer is dried at a temperature ranging from 80° C. to 150° C.

8. The method of claim 1, wherein the Step 20 further comprises:
    forming a color filter layer before the insulating layer is formed, and forming a pixel electrode layer on the insulating layer after the insulating layer is formed, wherein the color filter layer and the pixel electrode layer are located in a display area of the substrate.

9. The method of claim 8, wherein a material of the pixel electrode layer comprises indium tin oxide.

10. The method of claim 8, wherein a material of the insulating layer comprises a composite comprising one or more of SiOx, SiNx, and SiON.

11. The method of claim 1, wherein in the Step 30, a film thickness of a BSP on the hydrophobic layer is less than a film thickness of a BSP on the insulating layer after the BSP material is coated so that an accurate alignment process is performed by recognizing the alignment mark during an exposure process.

12. The method of claim 11, wherein the BSP on the hydrophobic layer and the BSP on the insulating layer are connected.

13. The method of claim 11, wherein the BSP on the hydrophobic layer and the BSP on the insulating layer are disconnected.

14. The method of claim 1, wherein in the Step 30, a BSP is not located on the hydrophobic layer after the BSP material is coated so that an accurate alignment process is performed by recognizing the alignment mark during an exposure process.

15. An array substrate, comprising a display area and a non-display area, wherein the non-display area comprises:
    a substrate;
    an alignment mark disposed on the substrate;
    an insulating layer disposed on the alignment mark;
    a hydrophobic layer disposed on the insulating layer corresponding to the alignment mark; and
    a black photo spacer (BSP) pattern disposed on the insulating layer;
    wherein the BSP pattern comprises a black matrix and a support post.

16. The array substrate of claim 15, wherein the display area comprises:
    an active layer disposed on the substrate, wherein the active layer comprises a first metal layer and a second metal layer;
    a color filter layer disposed on the active layer;

the insulating layer disposed on the color filter layer, wherein the insulating layer extends from the display area to the non-display area; and a pixel electrode layer disposed on the insulating layer;

wherein the alignment mark is formed from at least one of the first metal layer or the second metal layer.

17. The array substrate of claim 15, wherein a material of the hydrophobic layer comprises polyethylene terephthalate.

18. A liquid crystal display (LCD) panel, comprising:
a first substrate;
a second substrate disposed opposite to the first substrate; and
a plurality of liquid crystal molecules disposed between the first substrate and the second substrate;
wherein the second substrate comprises a display area and a non-display area, and the non-display area comprises:
a substrate;
an alignment mark disposed on the substrate;
an insulating layer disposed on the alignment mark;
a hydrophobic layer disposed on the insulating layer corresponding to the alignment mark; and
a black photo spacer (BSP) pattern disposed on the insulating layer;
wherein the BSP pattern comprises a black matrix and a support post.

19. The LCD panel of claim 18, wherein the display area comprises:
an active layer disposed on the substrate, wherein the active layer comprises a first metal layer and a second metal layer;
a color filter layer disposed on the active layer;
the insulating layer disposed on the color filter layer, wherein the insulating layer extends from the display area to the non-display area; and
a pixel electrode layer disposed on the insulating layer;
wherein the alignment mark is formed from at least one of the first metal layer or the second metal layer.

20. The LCD panel of claim 18, wherein a material of the hydrophobic layer comprises polyethylene terephthalate.

* * * * *